United States Patent
Shin et al.

(10) Patent No.: US 8,852,849 B2
(45) Date of Patent: Oct. 7, 2014

(54) ELECTRON BEAM LITHOGRAPHY SYSTEM AND METHOD FOR IMPROVING THROUGHPUT

(71) Applicant: Taiwan Semiconductor Manufacturing Company, Ltd., Hsin-Chu (TW)

(72) Inventors: Jaw-Jung Shin, Hsinchu (TW); Shy-Jay Lin, Jhudong Township (TW); Wen-Chuan Wang, Hsinchu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/971,702

(22) Filed: Aug. 20, 2013

(65) Prior Publication Data
US 2013/0327962 A1 Dec. 12, 2013

Related U.S. Application Data (62) Division of application No. 13/087,133, filed on Apr. 14, 2011, now Pat. No. 8,524,427.

(51) Int. Cl.
*G03F 7/20* (2006.01)
*H01J 37/317* (2006.01)
*H01J 37/302* (2006.01)

(52) U.S. Cl.
CPC .............. *G03F 7/20* (2013.01); *H01J 37/3174* (2013.01); *H01J 2237/31764* (2013.01); *H01J 37/3026* (2013.01); *G03F 7/2059* (2013.01); *Y10S 430/143* (2013.01)
USPC .......... 430/296; 430/30; 430/942; 250/492.2; 250/492.22; 250/492.3; 716/50; 716/53; 716/55

(58) Field of Classification Search
CPC ...... G03F 7/20; G03F 7/2059; H01J 37/3174; H01J 2237/31764; H01J 37/3026
USPC ............ 430/30, 296, 942; 250/492.2, 492.22, 250/492.3; 716/50, 53, 55
See application file for complete search history.

(56) References Cited

U.S. PATENT DOCUMENTS

| | | | |
|---|---|---|---|
| 6,783,905 B2* | 8/2004 | Yang | 430/30 |
| 6,870,172 B1* | 3/2005 | Mankos et al. | 250/492.22 |
| 7,799,489 B2* | 9/2010 | Fujimura et al. | 430/5 |
| 2010/0055581 A1* | 3/2010 | Fujimura et al. | 430/5 |

* cited by examiner

*Primary Examiner* — Christopher Young
(74) *Attorney, Agent, or Firm* — Haynes and Boone, LLP (57) ABSTRACT

An electron beam lithography method and apparatus for improving throughput is disclosed. An exemplary lithography method includes receiving a pattern layout having a pattern layout dimension; shrinking the pattern layout dimension; and overexposing a material layer to the shrunk pattern layout dimension, thereby forming the pattern layout having the pattern layout dimension on the material layer.

20 Claims, 7 Drawing Sheets

ELECTRON BEAM LITHOGRAPHY SYSTEM AND METHOD FOR IMPROVING THROUGHPUT

The present application is a divisional of U.S. Ser. No. 13/087,133 filed Apr. 14, 2011, the entire disclosure of which is hereby incorporated by reference.

BACKGROUND

Microfabrication conventionally uses photolithography or optical lithography processes for selectively removing parts of a substrate, or parts of a material layer on the substrate. For example, photolithography uses a directed light (radiation) source to transfer a pattern from a photomask (also referred to as a mask or reticle) to a light-sensitive resist material formed on the substrate or material layer, thereby generating an exposure pattern in the resist material. Chemical treatments may then be used to etch or otherwise transfer the exposure pattern in the resist material to the substrate or material layer. More recently, microfabrication has implemented other lithography types, such as charged particle beam lithography, that do not necessitate the intermediary step of creating the mask to transfer or generate an exposure pattern in a resist material. For example, electron beam (e-beam) lithography uses a focused beam of electrons to expose the resist material. Instead of using a mask, e-beam lithography "writes" a pattern directly into an energy-sensitive resist material using electron beams. An e-beam exposure tool generally writes the pattern from an electronic or computer-type file, which is used to control an exposure source of the e-beam exposure tool. The exposure source may be selectively directed onto the substrate, material layer, or resist material to be patterned. More particularly, the e-beam exposure tool is generally configured such that exposing a circuit pattern is not accomplished by illuminating the resist material through a mask or film negative of the circuit, but rather by directly and selectively exposing desired areas of the resist material or material layer on the substrate with a focused beam of an appropriate energy and dosage for creating the desired circuit pattern. E-beam lithography is particularly useful as device dimensions continually scale down. Its usefulness is limited by throughput (the time it takes to expose an entire wafer). For example, as device dimensions decrease and pattern densities of a pattern to be written increase, higher beam currents are typically used to write the pattern. However, it has been observed that higher beam currents may induce undesirable Coulomb effects, requiring increases in writing time to thwart such effects. Accordingly, although existing e-beam lithography systems and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
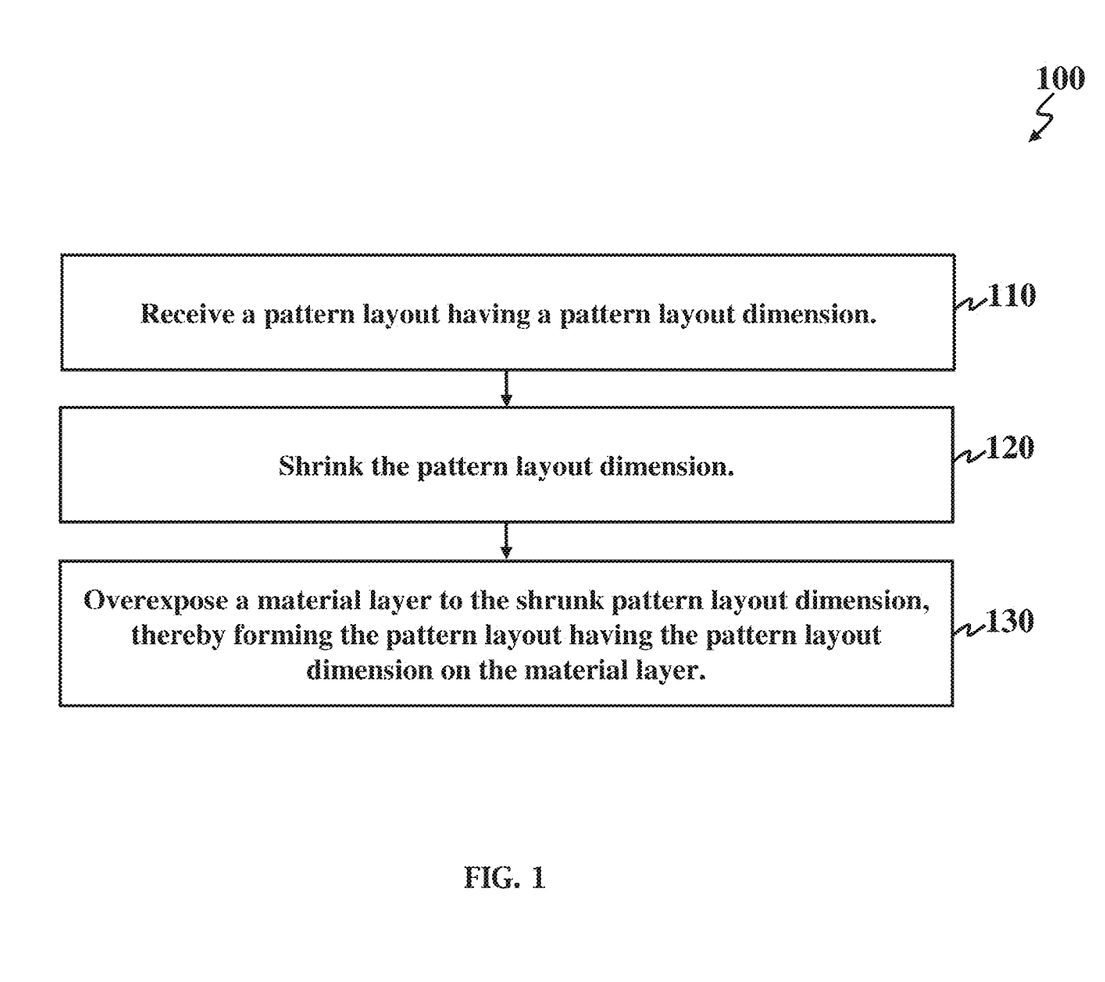
FIG. 1 is a flowchart of a lithography method according to various aspects of the present disclosure.

FIG. 1 is a flow chart of a lithography method 100 according to various aspects of the present disclosure. In the depicted embodiment, the lithography method 100 is a charged particle beam lithography method, specifically an electron beam lithography method. The lithography method 100 can be implemented to write a pattern, such as an integrated circuit pattern, on a wafer. The wafer is a semiconductor substrate, a mask blank, a glass substrate, a flat panel substrate, or other suitable substrate. The wafer may include a recording medium, such as an energy sensitive resist (or material) layer, formed thereon. FIG. 1 has been simplified for the sake of clarity to better understand the inventive concepts of the present disclosure. Additional steps can be provided before, during, and after the method 100, and some of the steps described can be replaced or eliminated for other embodiments of the method.

At block 110, a pattern layout is received, for example, by an electron beam lithography apparatus. The pattern layout may be presented in one or more data files having information of a pattern to be fabricated. The pattern layout can be expressed in a GDSII file format, a DFII file format, or other suitable file format. In the depicted embodiment, the pattern layout is an integrated circuit (IC) design layout. The IC design layout includes one or more features based on a specification of an IC device (product) to be manufactured. The features have various geometrical patterns designed for the IC device. The various geometrical patterns typically correspond to patterns of various conductor, insulator, and/or semiconductor layers that combine to form various IC features/components of the IC device, such as an active region, a gate electrode, a source and drain, a multilayer interconnection (MLI), a bonding pad opening, other suitable features/components, or combinations thereof.

The pattern layout has a pattern layout dimension. For example, the pattern layout has a critical dimension, defined as a dimension of a pattern feature (for example, a line width or a line length) or a space between two pattern features (for example, between two lines). The critical dimension contributes to overall pattern layout size and pattern layout density. A minimum critical dimension associated with the pattern layout can be defined as the smallest dimension of a pattern feature of the pattern layout, or the smallest space between two pattern features of the pattern layout. In the depicted embodiment, each feature of the pattern layout has a dimension or size, such as a length and a width. Each feature may have a dimension that is greater than or equal to the critical dimension(s) of the pattern layout.

The pattern layout also has an exposure dose associated therewith. In the depicted embodiment, the exposure dose includes an electron beam energy and an exposure time. When an electron beam lithography apparatus exposes a material layer to the pattern layout using the exposure dose, the pattern layout having the pattern layout dimension is formed on the material layer. Accordingly, the material layer includes the various features of the pattern layout, where dimensions of the various features formed on the material layer have the same dimensions as the various features of the pattern layout (in its file format).

Figure 2:
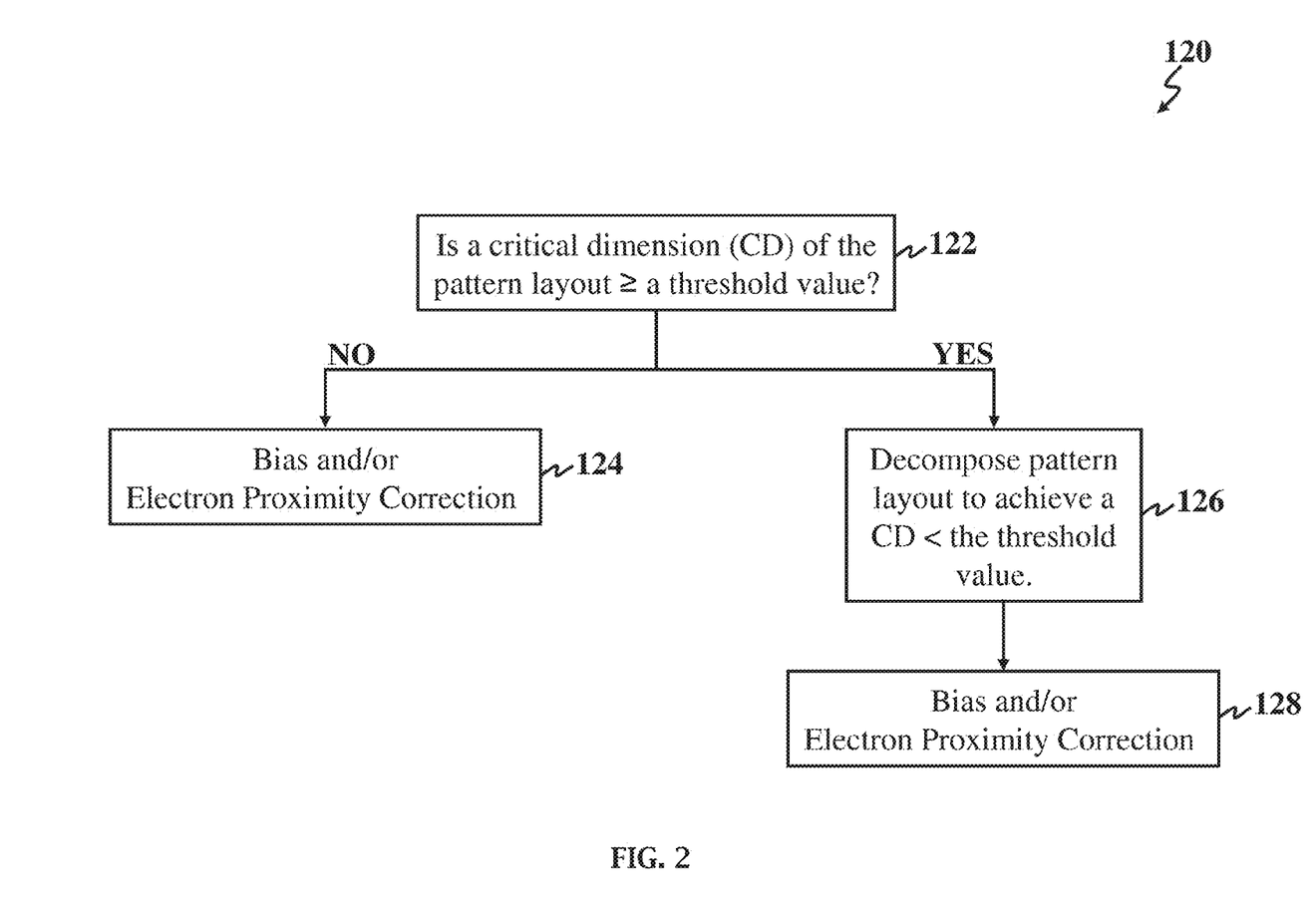
FIG. 2 is a flow chart of a method for shrinking a pattern layout dimension of a pattern layout that can be implemented by the lithography method of FIG. 1 according to various aspects of the present disclosure.

At block 120, the pattern layout dimension of the pattern layout is shrunk. Shrinking the pattern layout dimension involves reducing the pattern layout's pattern density. In an example, the pattern layout's critical dimension is reduced, such that the pattern layout's pattern density is reduced. FIG. 2 is a flow chart that illustrates a method for shrinking the pattern layout dimension of the pattern layout. In the depicted embodiment, the shrinking method is implemented by block 120 of the method 100 of FIG. 1. In FIG. 2, at block 122, the critical dimension of the pattern layout is evaluated to determine whether the critical dimension is greater than or equal to a threshold value. The threshold value is any suitable value. For example, the threshold value may be less than two times the minimum critical dimension of the pattern layout. The threshold value may be based on various parameters, such as a pixel size or sizes registered in an electron beam lithography apparatus or the various process conditions related to forming the pattern layout on a material layer.

If the critical dimension is less than the threshold value, at block 124, the pattern layout is biased to shrink its pattern layout dimension. Since the pattern layout dimension is reduced, this may be referred to as negatively biasing the pattern layout dimension. As described further below, biasing the pattern layout to shrink its pattern layout dimension may include reducing a size of the pattern layout's features. If the critical dimension is greater than or equal to the threshold value, at blocks 126 and 128, the pattern layout is decomposed to achieve a critical dimension that is less than the threshold value, and the decomposed pattern layout is biased to shrink its pattern layout dimension. In either situation, an electron proximity correction may be applied to the shrunk pattern layout, or shrunk and decomposed pattern layout. The pattern layout having the shrunk pattern layout dimension may be referred to as a shrunk pattern layout, which may be presented in one or more data files.

In a more specific example, biasing the pattern layout involves reducing dimensions of the pattern layout's features, such that the pattern layout's pattern density is reduced. For example, a size of each feature is reduced to a pixel size registered in the electron beam lithography apparatus. The pixel size may be about 0.1 to about 0.8 times the minimum critical dimension of the pattern layout. The dimensions of the pattern layout's features may be shrunk according to critical dimension biases of the features. Following the method illustrated in FIG. 2, each feature's size is evaluated to determine whether the size of the feature is greater than or equal to the threshold value. In the depicted embodiment, the threshold value is a threshold size. If the feature's size is less than the threshold size, then the feature is biased until the feature's size is about the pixel size registered in the electron beam lithography apparatus. If the feature's size is greater than the threshold size, then the feature is decomposed into more than one feature portion. Each feature portion has a size smaller than or equal to the threshold size. The feature portions are then biased until each feature portion's size is about the pixel size registered in the electron beam apparatus. In another example, a pattern layout may have features having a same critical dimension, and each feature may be biased (or have its size reduced) to various sizes according to each feature's surrounding environment (for example, according to whether the feature is a dense line feature or an isolated line feature). In another example, a pattern layout may have features having different critical dimensions, and each feature may be biased (or have its size reduced) to various sizes according to each feature's critical dimension. An electron proximity correction may be applied to the shrunk, or shrunk and decomposed, features. The pattern layout having the shrunk, or shrunk and decomposed, pattern features may be referred to as a shrunk pattern layout, which may be presented in one or more data files.

At block 130, overexposing a material layer to the shrunk pattern layout dimension of the pattern layout forms the pattern layout having the pattern layout dimension on the material layer. For example, an exposure dose that is higher than the exposure dose associated with the pattern layout (in its original pattern layout dimension) is used to write the shrunk pattern layout dimension of the pattern layout on the material layer. The higher exposure dose may be in the form of a higher electron beam current. The shrunk pattern layout dimension of the pattern layout may be written using a raster scanning method or a vector scanning method. Using the higher exposure dose to write the shrunk pattern layout dimension of the pattern layout forms the pattern layout having the pattern layout dimension, as designed. Since the shrunk pattern layout dimension reduces actual pattern layout density exposed, throughput for forming the pattern layout may be improved.

FIGS. 3-6 illustrate various portions of a pattern layout that can be formed on a material layer using the method 100 of FIG. 1. As described below, the various portions of the pattern layout are biased, or decomposed and biased, to reduce a pattern density of the pattern layout. The biased, and/or decomposed and biased portions, can then be written on the material layer using an overexposure, specifically an increased beam current, to form the pattern layout. Actual pattern density of the pattern layout exposed by a charged particle beam is thus reduced, thereby decreasing throughput. Accordingly, though a pattern layout's pattern density may increase, the disclosed method improves throughput by decreasing the actual pattern density exposed. Different embodiments may have different advantages, and no particular advantage is necessarily required of any embodiment.

Figure 3:
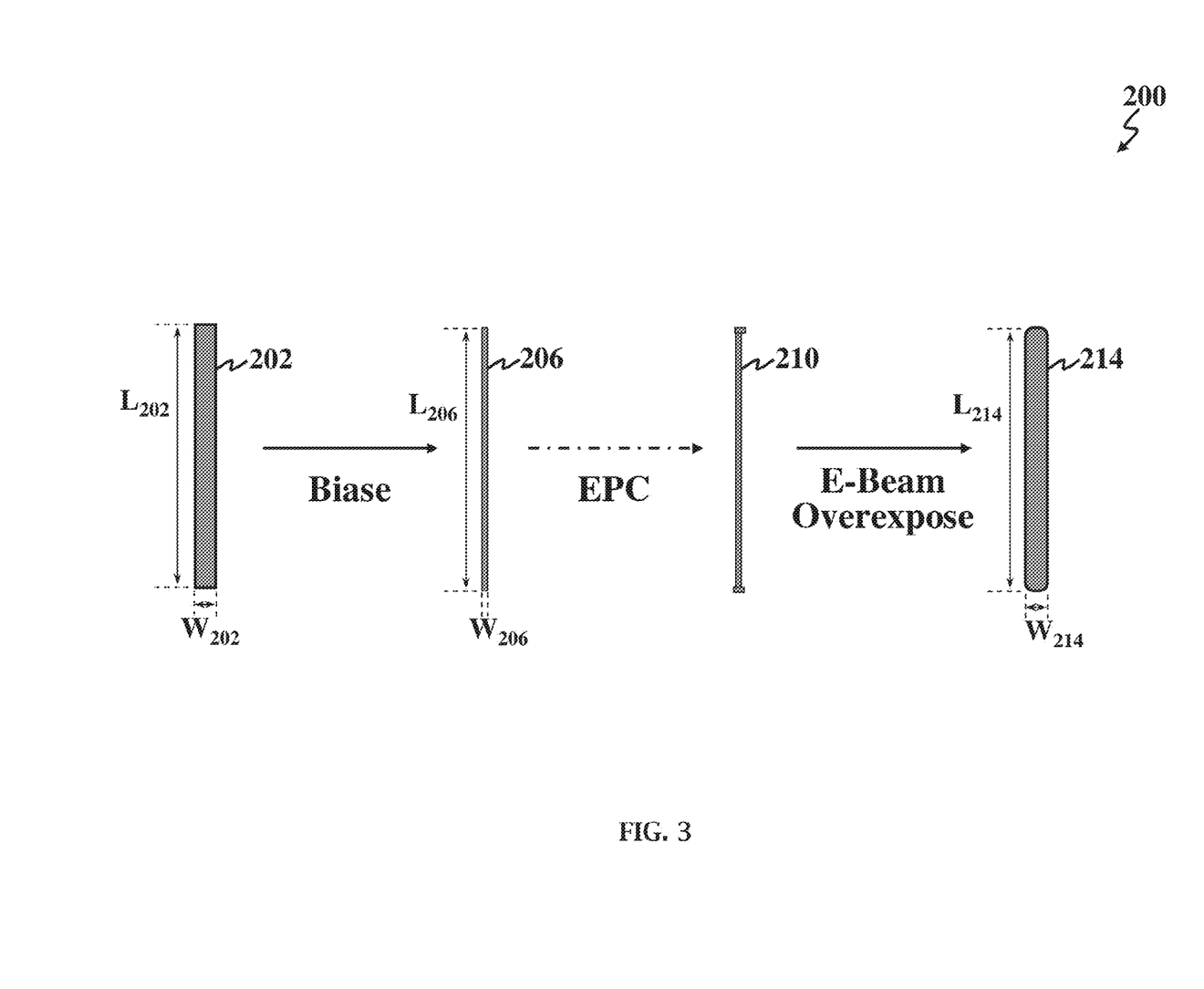
FIG. 3 illustrates a portion of a pattern layout that can be formed according to the method 100 of FIG. 1.

FIG. 3 illustrates a portion 200 of a pattern layout that is formed on a material layer according to the method 100 of FIG. 1. In FIG. 3, the pattern layout includes a pattern feature 202. The pattern feature 202 has a dimension, such as a length ($L_{202}$) and a width ($W_{202}$). In the depicted embodiment, $W_{202}$ equals a minimum critical dimension of the pattern layout. An exposure dose is associated with the pattern feature 202 that ensures that the pattern feature 202 is written on a material layer with the dimensions as designed, such as with $L_{202}$ and $W_{202}$. The pattern feature 202 is evaluated using block 120 of the method 100 of FIGS. 1 and 2. In the depicted embodiment, $W_{202}$ is less than a predetermined threshold size (block 122 of FIG. 2), so the pattern feature 202 is biased to shrink the width, $W_{202}$, of the pattern feature 202 (block 124 of FIG. 2). For example, the pattern feature 202 is negatively biased to provide a shrunk pattern feature 206. The shrunk pattern feature 206 has a dimension that is smaller than the dimension of pattern feature 202. Specifically, the shrunk pattern feature 206 has a width ($W_{206}$) that is smaller than $W_{202}$ of the pattern feature 202. $W_{206}$ is about a pixel size registered in an electron beam lithography apparatus, such as the electron beam lithography apparatus that will be used to form the pattern feature 202 on a material layer. The shrunk pattern feature 206 also has a length ($L_{206}$). $L_{206}$ is about equal to $L_{202}$. An electron proximity correction (EPC) may be performed on the shrunk pattern feature 206, thereby providing a biased/EPCed pattern feature 210. The biased/EPCed pattern feature 210 (or alternatively, the biased pattern feature 206) is then written on a material layer using an exposure does that is greater than the exposure dose associated with the pattern feature 202. In other words, an overexposure is used to write the biased/EPCed pattern feature 210 (or the biased pattern feature 206) on the material layer, thereby forming pattern feature 214 on the material layer. The pattern feature 214 corresponds with the pattern feature 202. More specifically, the pattern feature 214 has a dimension, specifically a length ($L_{214}$) and a width ($W_{214}$), that is substantially equivalent to the dimension, $L_{202}$ and $W_{202}$, of pattern feature 202. The pattern feature 202 is thus formed on the material layer by overexposing the material layer to pattern feature 210, which has a smaller dimension than the pattern feature 202.

Figure 4:
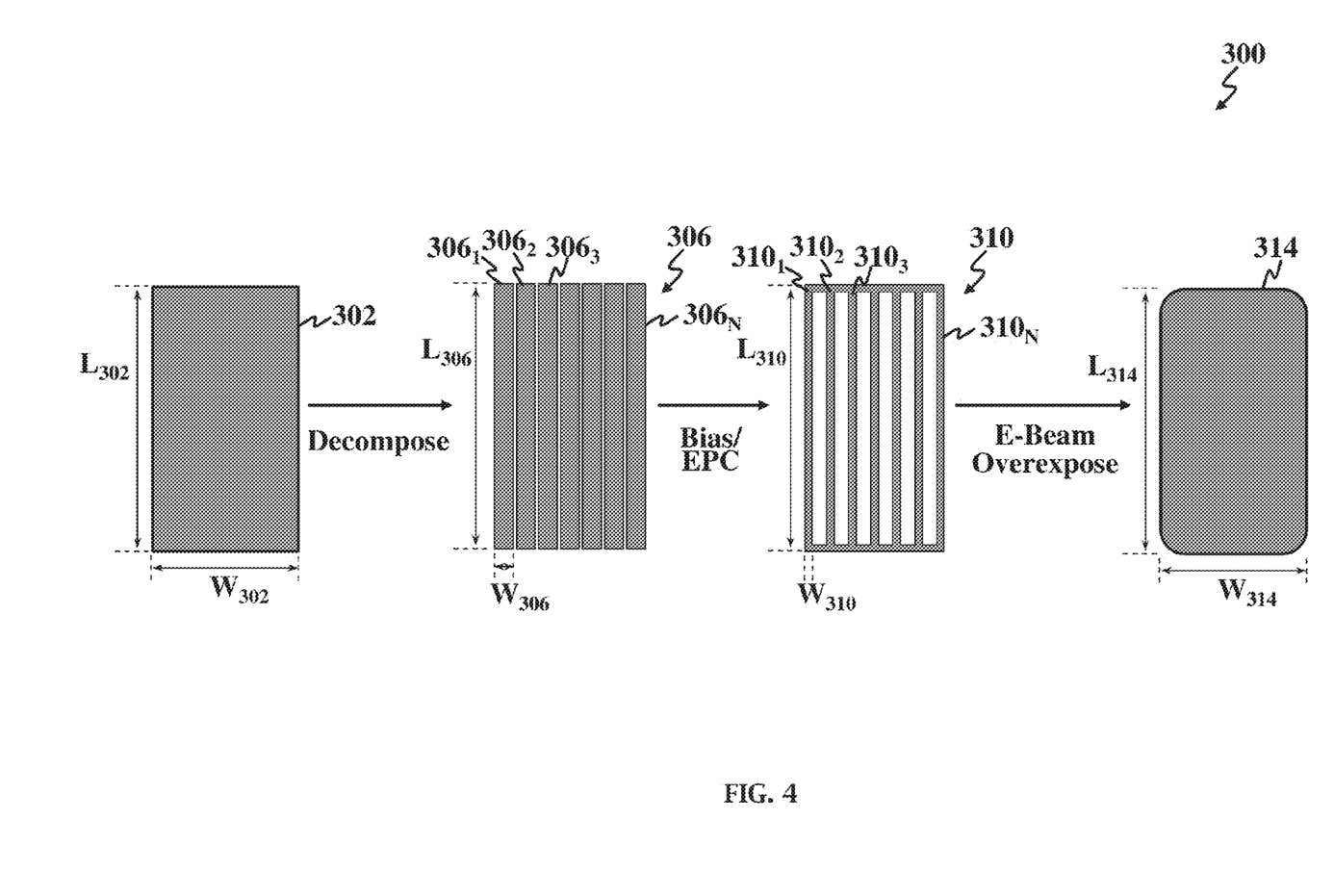
FIG. 4 illustrates a portion of a pattern layout that can be formed according to the method 100 of FIG. 1.

FIG. 4 illustrates a portion 300 of a pattern layout that is formed on a material layer according to the method 100 of FIG. 1. In FIG. 4, the pattern layout includes a pattern feature 302. The pattern feature 302 has a dimension, such as a length ($L_{302}$) and a width ($W_{302}$). In the depicted embodiment, $W_{302}$ is greater than a minimum critical dimension of the pattern layout. An exposure dose is associated with the pattern feature 302 that ensures that the pattern feature 302 is written on a material layer with the dimension, $L_{302}$ and $W_{302}$. In the depicted embodiment, the pattern feature 302 is evaluated using block 120 of the method 100 of FIGS. 1 and 2. In the depicted embodiment, $W_{302}$ is greater than a predetermined threshold size (block 122 of FIG. 2), so the pattern feature 302 is decomposed and biased to shrink the dimension of the pattern feature 302 (blocks 126 and 128 of FIG. 2). For example, the pattern feature 302 is decomposed into a feature 306 that includes feature portions $306_1$, $306_2$, $306_3$, ... $306_N$. Each feature portion $306_1$, $306_2$, $306_3$, ... $306_N$ has a dimension, such as a length ($L_{306}$) and a width ($W_{306}$). $L_{306}$ is about $L_{302}$, and $W_{306}$ may be about the minimum critical dimension of the pattern layout. The feature portions $306_1$, $306_2$, $306_3$, ... $306_N$ accordingly have a length that is about the length of the original pattern feature 302, but a width that is smaller than the original pattern feature 302. The feature 306 is then negatively biased to provide a shrunk feature 310, where each feature portion $306_1$, $306_2$, $306_3$, ... $306_N$ is shrunk to have a smaller dimension. In the depicted embodiment, an electron proximity correction (EPC) is also performed on the decomposed feature portions of feature 306. Accordingly, feature 310 includes feature portions $310_1$, $310_2$, $310_3$, ... $310_N$. Each of the feature portions $310_1$, $310_2$, $310_3$, ... $310_N$ have a width ($W_{310}$) that is smaller than the decomposed width, $W_{306}$. $W_{310}$ is about a pixel size registered in an electron beam lithography apparatus, such as the electron beam lithography apparatus that will be used to form the pattern feature 302 on a material layer. Each of the feature portions $310_1$, $310_2$, $310_3$, ... $310_N$ also have a length ($L_{310}$) that is about $L_{302}$. The biased/EPCed pattern feature 310 is then written on a material layer using an exposure does that is greater than the exposure dose associated with the pattern feature 302. In other words, an overexposure is used to write the biased/EPCed pattern feature 310 on the material layer, thereby forming pattern feature 314 on the material layer. The pattern feature 314 corresponds with the pattern feature 302. More specifically, the pattern feature 314 has a dimension, specifically a length ($L_{314}$) and a width ($W_{314}$), that is substantially equivalent to the dimension, $L_{302}$ and $W_{302}$, of pattern feature 302. The pattern feature 302 is thus formed on the material layer by overexposing the material layer to pattern feature 310, which has feature portions with smaller dimensions than the pattern feature 302.

Figure 5:
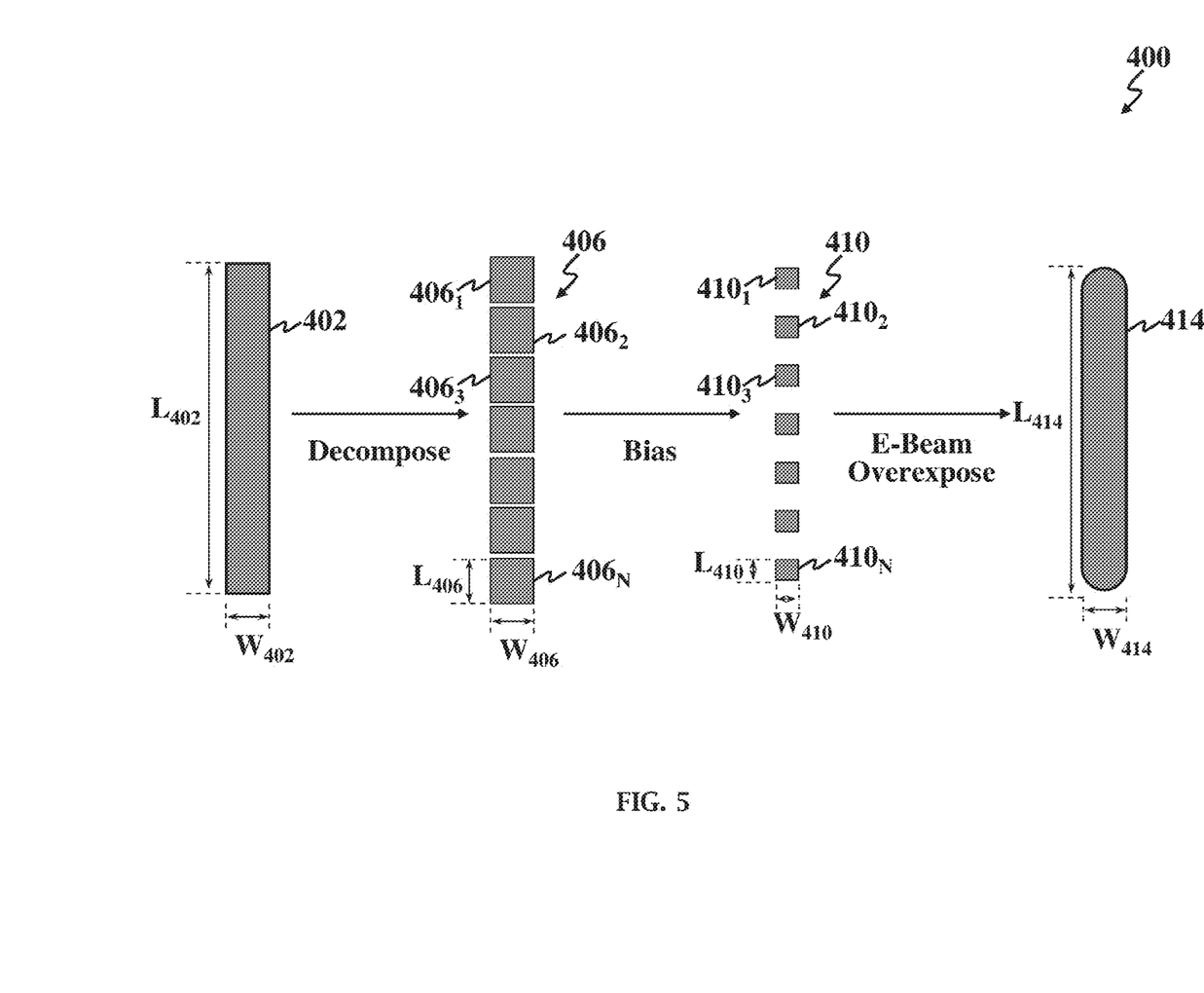
FIG. 5 illustrates a portion of a pattern layout that can be formed according to the method 100 of FIG. 1.

FIG. 5 illustrates a portion 400 of a pattern layout that is formed on a material layer according to the method 100 of FIG. 1. In FIG. 5, the pattern layout includes a pattern feature 402. The pattern feature 402 has a dimension, such as a length ($L_{402}$) and a width ($W_{402}$). An exposure dose is associated with the pattern feature 402 that ensures that the pattern feature 402 is written on a material layer with the dimension, $L_{402}$ and $W_{402}$. In the depicted embodiment, the pattern feature 402 is evaluated using block 120 of the method 100 of FIGS. 1 and 2. In the depicted embodiment, $W_{402}$ is greater than a predetermined threshold size (block 122 of FIG. 2), so the pattern feature 402 is decomposed and biased to shrink the dimension of the pattern feature 402 (blocks 126 and 128 of FIG. 2). For example, the pattern feature 402 is decomposed into a feature 406 that includes feature portions $406_1$, $406_2$, $406_3$, ... $406_N$. Each feature portion $406_1$, $406_2$, $406_3$, ... $406_N$ has a dimension, such as a length ($L_{406}$) and a width ($W_{406}$). $W_{406}$ is about $W_{402}$, and $L_{406}$ may be about the minimum critical dimension of the pattern layout. The feature portions $406_1$, $406_2$, $406_3$, ... $406_N$ accordingly have a width that is about the width of the original pattern feature 402, but a length that is smaller than the original pattern feature 402. The feature 406 is then negatively biased to provide a shrunk feature 310, where each feature portion $406_1$, $406_2$, $406_3$, ... $406_N$ is shrunk to have a smaller dimension. More specifically, the shrunk feature 406 provides a feature 410 having feature portions $410_1$, $410_2$, $410_3$, ... $410_N$. Each of the feature portions $410_1$, $410_2$, $410_3$, ... $410_N$ have a length ($L_{410}$) that is smaller than the decomposed length, $L_{406}$, and a width ($W_{410}$) that is smaller than the decomposed width, $W_{406}$. $W_{410}$ is about a pixel size registered in an electron beam lithography apparatus, such as the electron beam lithography apparatus that will be used to form the pattern feature 402 on a material layer. An electron proximity correction (EPC) may be performed on the shrunk and decomposed feature 410. The biased and decomposed pattern feature 410 is then written on a material layer using an exposure does that is greater than the exposure dose associated with the pattern feature 402. In other words, an overexposure is used to write the biased pattern feature 410 on the material layer, thereby forming pattern feature 414 on the material layer. The pattern feature 414 corresponds with the pattern feature 402. More specifically, the pattern feature 414 has a dimension, specifically a length ($L_{414}$) and a width ($W_{414}$), that is substantially equivalent to the dimension, $L_{402}$ and $W_{402}$, of pattern feature 402. The pattern feature 402 is thus formed on the material layer by overexposing the material layer to pattern feature 410, which has feature portions with smaller dimensions than the pattern feature 402.

Figure 6:
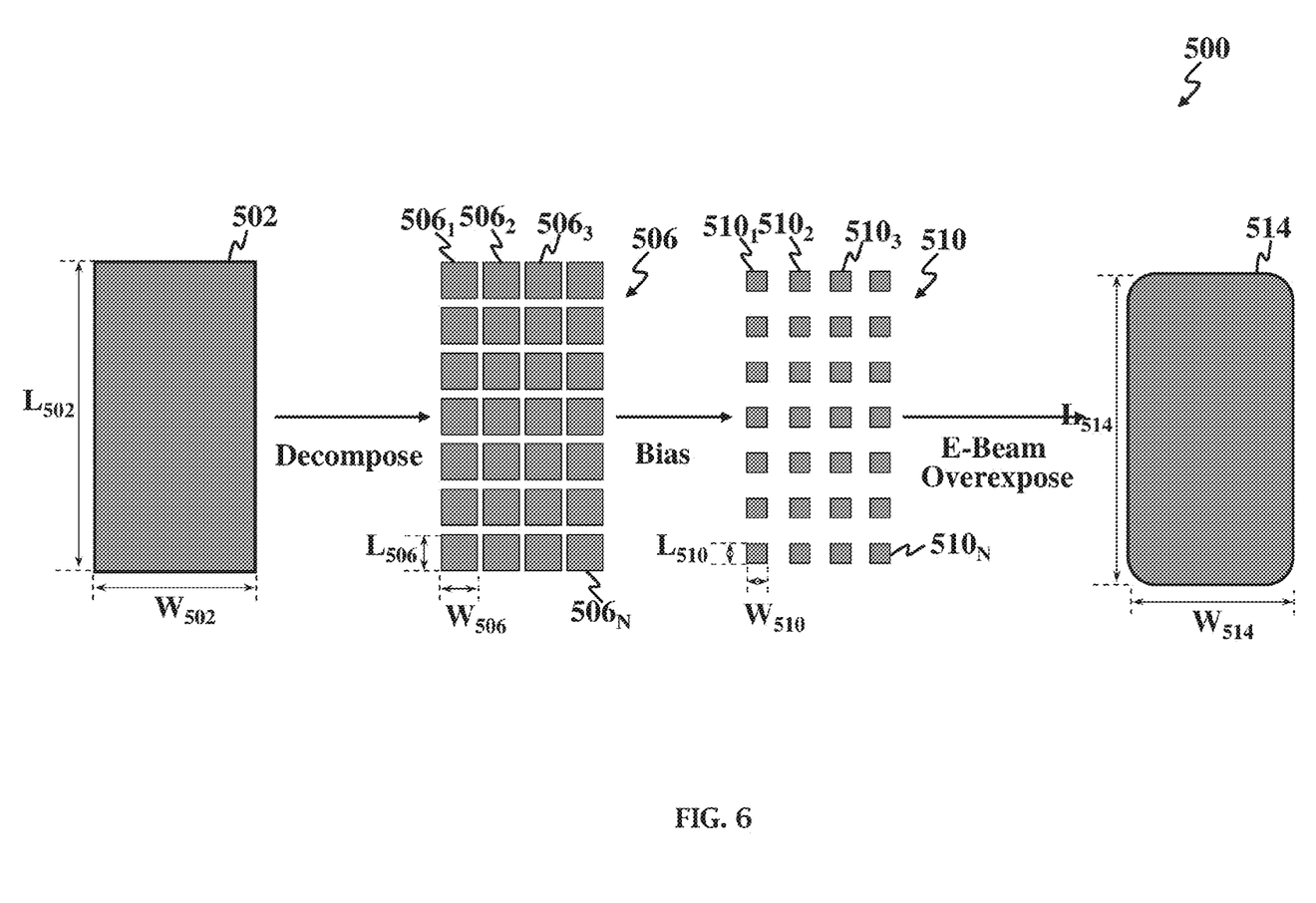
FIG. 6 illustrates a portion of a pattern layout that can be formed according to the method 100 of FIG. 1.

FIG. 6 illustrates a portion 500 of a pattern layout that is formed on a material layer according to the method 100 of FIG. 1. In FIG. 6, the pattern layout includes a pattern feature 502. The pattern feature 502 has a dimension, such as a length ($L_{502}$) and a width ($W_{502}$). An exposure dose is associated with the pattern feature 502 that ensures that the pattern feature 502 is written on a material layer with the dimension, $L_{502}$ and $W_{502}$. In the depicted embodiment, the pattern feature 502 is evaluated using block 120 of the method 100 of FIGS. 1 and 2. In the depicted embodiment, $W_{502}$ is greater than a predetermined threshold size (block 122 of FIG. 2), so the pattern feature 502 is decomposed and biased to shrink the dimension of the pattern feature 502 (blocks 126 and 128 of FIG. 2). For example, the pattern feature 502 is decomposed into a feature 506 that includes feature portions $506_1$, $506_2$, $506_3$, ... $506_N$. Each feature portion $506_1$, $506_2$, $506_3$, ... $506_N$ has a dimension, such as a length ($L_{506}$) and a width ($W_{506}$). $L_{406}$ is may be about the minimum critical dimension of the pattern layout, and $W_{406}$ may be about the minimum critical dimension of the pattern layout. The feature portions $506_1$, $506_2$, $506_3$, ... $506_N$ accordingly have a width that is smaller than the width of the original pattern feature 502, and a length that is smaller than the length of the original pattern feature 502. The feature 506 is then negatively biased to provide a shrunk feature 510, where each feature portion $506_1$, $506_2$, $506_3$, ... $506_N$ is shrunk to have a smaller dimension. More specifically, the shrunk feature 506 provides feature 510 having feature portions $510_1$, $510_2$, $510_3$, ... $510_N$. Each of the feature portions $510_1$, $510_2$, $510_3$, ... $510_N$ have a length ($L_{510}$) that is smaller than the decomposed length, $L_{506}$, and a width ($W_{510}$) that is smaller than the decomposed width, $W_{506}$. $L_{510}$ and $W_{510}$ are about a pixel size registered in an electron beam lithography apparatus, such as the electron beam lithography apparatus that will be used to form the pattern feature 502 on a material layer. An electron proximity correction (EPC) may be performed on the shrunk and decomposed feature 510. The biased and decomposed pattern feature 510 is then written on a material layer using an exposure does that is greater than the exposure dose associated with the pattern feature 502. In other words, an overexposure is used to write the biased pattern feature 510 on the material layer, thereby forming pattern feature 514 on the material layer. The pattern feature 514 corresponds with the pattern feature 502. More specifically, the pattern feature 514 has a dimension, specifically a length ($L_{4514}$) and a width ($W_{514}$), that is substantially equivalent to the dimension, $L_{502}$ and $W_{502}$, of pattern feature 502. The pattern feature 502 is thus formed on the material layer by overexposing the material layer to pattern feature 510, which has feature portions with smaller dimensions than the pattern feature 502.

Figure 7:
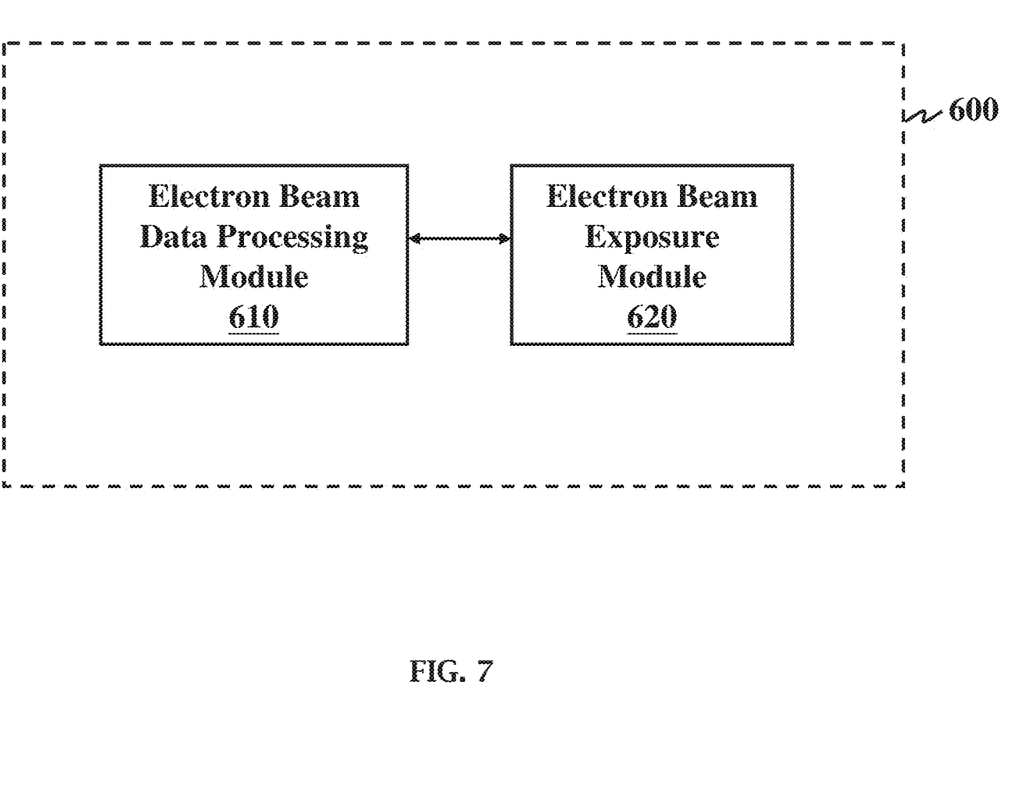
FIG. 7 is a simplified block diagram of a lithography apparatus that can implement the lithography method of FIG. 1 according to various aspects of the present disclosure.

FIG. 7 is a simplified block diagram of a lithography apparatus 600 according to various aspects of the present disclosure. In the depicted embodiment, the lithography apparatus 600 is an electron beam lithography apparatus. The lithography apparatus 600 can implement the method 100 of FIG. 1 to write a pattern, such as an integrated circuit pattern, on a wafer. The wafer is a semiconductor substrate, a mask blank, a glass substrate, a flat panel substrate, or other suitable substrate. The wafer may include a recording medium, such as an energy sensitive resist (or material) layer, formed thereon. FIG. 7 has been simplified for the sake of clarity to better understand the inventive concepts of the present disclosure. Additional features can be added in the lithography apparatus 600, and some of the features described below can be replaced or eliminated for additional embodiments of the lithography apparatus 600.

In the depicted embodiment, the lithography apparatus includes an electron beam data processing module 610 and an electron beam exposure module 620. The electron beam data processing module 610 and the electron beam exposure module 620 are in communication with one another. The electron beam data processing module 610 is configured to read patterning data from a data storage medium, which may be within the electron beam data processing module 610, or remotely positioned and in communication with the electron beam data processing module 610. The electron beam data processing module 610 obtains or receives the patterning data and can load it into a memory associated with the electron beam data processing module 610. In the depicted embodiment, the patterning data includes a pattern layout, such as an IC design layout as described above. The electron beam data processing module 610 includes a pattern generator that processes the patterning data and generates a pattern writing instruction set, for example, a pattern writing set associated with the pattern layout. The electron beam data processing module 610 is also configured to reduce a pattern density of a pattern, for example, by using the method 100 of FIG. 1. The pattern generator that processes the patterning data and generates a pattern writing instruction set can also generate patterning data and a pattern writing instruction set associated with the pattern having the reduced pattern density. The electron beam data processing module 610 sends the writing instruction set to the electron beam exposure module 620. Additionally, the electron beam data processing module 610 may electron perform proximity correction and transformation to the writing instruction for the electron beam exposure module 620. Alternatively, the proximity correction and transformation may optionally be performed separately by a standalone module.

The electron beam exposure module 620 includes a source that is configured to generate at least one charged particle beam. In the depicted embodiment, since the lithography apparatus 600 is an electron beam lithography apparatus 600, the charged particle beam is an electron beam. Alternatively, the charged particle beam may be a photon beam or ion beam. The charged particle beam may pass through one or more lenses (not shown). In an example, the charged particle beam may pass through the one or more lenses and may be focused to a beam aperture portion configured with a plurality of apertures or openings that split the charged particle beam into a plurality of beams. The number of beams may vary depending on design requirements of the lithography apparatus. The charged particle beam may be a Gaussian beam or a plurality of Gaussian beam. The charged particle beam may travel to a beam controller that is configured to allow one or more of the beams to pass through to an imaging head, or to block/blank one or more of the beams from passing through to the imaging head. The imaging head may include an electron optical system for focusing the beams that are allowed to pass through. The beam controller may include a plurality of deflectors (also referred to as blankers) that are controlled by electrical control signals that are associated with the writing instructions sent from the electron beam data processing module 610.

The electron beam exposure module 620 may further include a controller that receives the writing instructions from the DPU 102. The writing instructions may be sent using light radiation as carriers of the information. The lithography apparatus 600 further includes a stage (not shown) that is configured to move in various directions. The stage may hold and secure a wafer by a vacuum system or other suitable securing mechanism. During processing, the wafer is moved or scanned relative to the imaging head and in cooperation with the controller. The charged particle beam is focused, by the lithography apparatus 600, onto the recording medium such that the pattern layout is written directly into the recording medium, without a photomask or reticle. In the depicted embodiment, as described above, the pattern layout having the shrunk pattern layout dimension is written directly into the recording medium, using an exposure dose that is greater than the exposure dose associated with the pattern layout having the originally designed pattern layout dimension. After the entire wafer has been scanned, the recording medium may be developed to form the pattern over the wafer, and other processing, such as etching and doping, may be performed using the patterned recording medium. It is understood that the lithography apparatus 600 may include other components such as an alignment system and collimator, but is simplified for a better understanding of the disclosed embodiments herein.

The present disclosure provides for many different embodiments. For example, a method includes receiving a pattern layout having a plurality of features, wherein an exposure dose is associated with the pattern layout; biasing the pattern layout such that a size of each of the plurality of features is reduced to a pixel size registered in an electron-beam apparatus; and exposing a material layer to the biased pattern layout using the electron-beam apparatus, wherein the exposing uses a greater exposure dose than the exposure dose associated with the pattern layout, thereby forming the pattern layout on the material layer.

Biasing the pattern layout may include shrinking each of the plurality of features according to critical dimension bias. In an example, biasing the pattern layout includes reducing the size of each of the plurality of features to a size that is about 0.1 to about 0.8 times a minimum critical dimension of the pattern layout. Biasing the pattern layout may include, for each of the plurality of features determining whether a size of the feature is greater than a threshold size before biasing the pattern layout, and if the size of the feature is greater than the threshold size, decomposing the feature to have more than one feature portion, wherein each feature portion is smaller than or equal to the threshold size. In an example, the threshold size is less than two times a minimum critical dimension of the pattern layout.

The method may further include performing an electron proximity correction on the biased pattern layout before exposing the material layer, and/or determining the exposure dose associated with the pattern layout. Using a greater exposure dose than the exposure dose associated with the pattern layout may include determining the greater exposure dose based on the shrunk pattern layout. In an example, forming the pattern layout on the material layer includes forming an integrated circuit pattern on the material layer.

In another example, a method includes receiving a pattern layout having a pattern layout dimension; shrinking the pattern layout dimension; and overexposing a material layer to the shrunk pattern layout dimension, thereby forming the pattern layout having the pattern layout dimension on the material layer. Shrinking the pattern layout dimension may include reducing a pattern density of the pattern layout. In an example, the pattern layout dimension is a critical dimension, and shrinking the pattern layout dimension includes reducing the critical dimension. The method may further include determining whether the critical dimension is greater than a threshold value before reducing the critical dimension, and if the critical dimension is greater than the threshold value, decomposing the pattern layout to have a critical dimension less than the threshold value. The method may further include performing an electron proximity correction to the pattern layout having the shrunk pattern layout dimension. In an example, an exposure dose is associated with the pattern layout having the pattern layout dimension, and overexposing the material layer to the shrunk pattern layout dimension includes using an exposure dose that is greater than the exposure dose associated with the pattern layout having the pattern layout dimension.

In an example, the pattern layout includes a plurality of features, and shrinking the pattern layout dimension includes shrinking a dimension of each of the plurality of features to a pixel size registered in an electron beam tool. Shrinking a dimension of each of the plurality of features to a pixel size registered in the electron beam tool may include, for each of the plurality of features determining a critical dimension of the feature; if the critical dimension is less than a threshold value, shrinking the feature to the pixel size registered in the electron beam tool; and if the critical dimension is larger than or equal to the threshold value, decomposing the feature into more than one feature portion having a critical dimension less than the threshold value and shrinking each of the more than one feature portion to the pixel size registered in the electron beam tool.

An electron beam apparatus is also provided that includes an electron beam exposure module and an electron beam data processing module in communication with the electron beam exposure module. The electron beam data processing module programmed to receive a pattern layout having a pattern layout dimension, shrink the pattern layout dimension, and determine an exposure dose that is greater than an exposure dose associated with the pattern layout having the pattern layout dimension, such that the electron beam exposure module uses the shrunk pattern layout dimension and the determined exposure dose for forming the pattern layout having the pattern layout dimension on a material layer. The electron beam data processing module may be programmed to determine the exposure dose associated with the pattern layout having the pattern layout dimension. Shrinking the pattern layout dimension may be configured to shrink a pattern density of the pattern layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. An electron beam apparatus comprising:
an electron beam data processing module programmed to:
 receive a pattern layout having a feature,
 decompose the feature into a plurality of sub-features, and
 shrink the plurality of sub-features, thereby forming a biased feature; and
an electron beam module in communication with the electron beam data processing module and designed to provide an electron beam for electron-beam writing according to the biased feature.

2. The electron beam apparatus of claim 1 wherein the electron beam data processing module is programmed to determine the writing dose associated with the biased feature.

3. The electron beam apparatus of claim 1 wherein the electron beam data processing module is programmed to shrink a pattern density of the pattern layout.

4. An electron beam apparatus comprising:
   means for receiving a pattern layout having at least one feature;
   means for determining a size of the at least one feature is greater than a predetermined value;
   means for converting the at least one feature into a biased feature that has a plurality of sub-features having space interposing each of the plurality of sub-features; and
   means for writing an energy sensitive material layer according to the biased feature, thereby forming the at least one feature in the energy sensitive material layer, and wherein the writing is a direct writing without a photomask.

5. The apparatus of claim 4 wherein the means for writing is configured to provide different writing doses, such that writing the energy sensitive material layer according to the biased feature uses a greater writing dose than a writing dose associated with the at least one feature.

6. The apparatus of claim 4 wherein the means for converting the at least one feature includes a mechanism for biasing the at least one feature such that a size of each of the plurality of sub-features is reduced to a pixel size registered in the electron beam apparatus.

7. The apparatus of claim 6 wherein the means for biasing the at least one feature is configured such that the size of each of the plurality of sub-features is reduced to the pixel size registered in the electron beam apparatus, including reducing the size of each of the plurality of sub-features to a size that is about 0.1 to about 0.8 times a minimum critical dimension of the pattern layout.

8. The apparatus of claim 6 wherein the means for biasing the at least one feature is configured such that the size of each of the plurality of sub-features is reduced to the pixel size registered in the electron beam apparatus, including shrinking each of the plurality of sub-features according to critical dimension bias.

9. The apparatus of claim 4 wherein the predetermined size is a threshold; and further comprising:
   means for decomposing the at least one feature to have the plurality of sub-features if the size of the at least one feature is greater than the threshold size, wherein each sub-feature is smaller than or equal to the threshold size.

10. The apparatus of claim 9 wherein the threshold size is less than two times a minimum critical dimension of the pattern layout.

11. The apparatus of claim 4 further including means for performing an electron proximity correction on the biased feature before writing the energy sensitive material layer.

12. The apparatus of claim 4 further including means for determining the writing dose associated with the at least one feature.

13. An electron beam apparatus comprising:
   an electron beam data processing module programmed to:
      determine a predetermined size based on a pixel size registered in the electron beam apparatus;
      receive a pattern layout having a first feature and a second feature;
      decompose the first feature into a plurality of first sub-features, wherein each of the plurality of sub-features have a space therebetween; and
      shrink the second feature and the plurality of first sub-features, wherein the shrinking includes shrinking a dimension of the second feature and each of the plurality of first sub-features to the predetermined size; and
   an electron beam module in communication with the electron beam data processing module and designed to provide an electron beam for electron-beam writing according to the shrunk second feature and plurality of first sub-features, thereby forming the first feature and the second feature on the material layer.

14. The apparatus of claim 13 wherein the decomposing and shrinking includes reducing a pattern density of the pattern layout.

15. The apparatus of claim 13 wherein:
   the pattern layout has a critical dimension; and
   the shrinking the second feature and the plurality of first sub-features includes reducing the critical dimension.

16. The apparatus of claim 13 wherein the shrinking includes shrinking a dimension of the second feature and each of the plurality of first sub-features to a pixel size registered in an electron beam tool.

17. The apparatus of claim 13 wherein the electron beam data processing module is further programmed to:
   provide a threshold value that is the predetermined value;
   determine that a critical dimension of the first feature is greater than or equal to the threshold value before decomposing the first feature; and
   determine that a critical dimension of the second feature has a critical dimension less than the threshold value before shrinking the second feature.

18. The apparatus of claim 17 wherein decomposing the first feature into the plurality of first sub-features includes decomposing the first feature into the plurality of first sub-features, wherein each sub-feature has a dimension that is less than the threshold value.

19. The apparatus of claim 13 wherein the electron beam data processing module is further programmed to:
   perform an electron proximity correction to the shrunk second feature and the shrunk plurality of first sub-features.

20. The apparatus of claim 13 wherein:
   a writing dose is associated with the first feature and the second feature; and
   writing the material layer according to the shrunk second feature and the plurality of first sub-features includes using a writing dose that is greater than the writing dose associated with the second feature and first feature, respectively.

* * * * *